US008653654B2

(12) United States Patent
Chandra et al.

(10) Patent No.: US 8,653,654 B2

(45) Date of Patent: Feb. 18, 2014

(54) INTEGRATED CIRCUIT PACKAGING SYSTEM WITH A STACKABLE PACKAGE AND METHOD OF MANUFACTURE THEREOF

(75) Inventors: Harry Chandra, Phoenix, AZ (US); Robert J. Martin, III, Salida, CA (US)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/639,990

(22) Filed: Dec. 16, 2009

(65) Prior Publication Data

US 2011/0140283 A1 Jun. 16, 2011

(51) Int. Cl.
*H01L 23/34* (2006.01)

(52) U.S. Cl.
USPC ............................ 257/724; 257/723; 438/110

(58) Field of Classification Search
USPC .......... 257/686, 777, 723, 724; 438/107, 109, 438/110
See application file for complete search history.

(56) References Cited

U.S. PATENT DOCUMENTS

| | | | | |
|---|---|---|---|---|
| 6,828,665 | B2 | 12/2004 | Pu et al. | |
| 7,015,571 | B2 | 3/2006 | Chang et al. | |
| 7,800,212 | B2 * | 9/2010 | Yoon et al. | 257/686 |
| 7,863,755 | B2 * | 1/2011 | Lee et al. | 257/777 |
| 7,919,871 | B2 * | 4/2011 | Moon et al. | 257/777 |
| 7,977,780 | B2 * | 7/2011 | Tay et al. | 257/686 |
| 2006/0175695 | A1 | 8/2006 | Lee | |
| 2008/0088011 | A1 | 4/2008 | Hu et al. | |
| 2008/0164595 | A1 | 7/2008 | Wu et al. | |
| 2009/0166886 | A1 | 7/2009 | Kim et al. | |

* cited by examiner

*Primary Examiner* — Sheila V. Clark

(74) *Attorney, Agent, or Firm* — Ishimaru & Associates LLP

(57) ABSTRACT

A method of manufacture of an integrated circuit packaging system includes: forming a base assembly having a cavity and a through conductor adjacent to the cavity; connecting a first device to the base assembly with the first device within the cavity; connecting a second device to the base assembly with the second device within the cavity; and connecting an interposer substrate having an exposed external side over the through conductor with the exposed external side facing away from the through conductor and exposed to ambient.

20 Claims, 6 Drawing Sheets

INTEGRATED CIRCUIT PACKAGING SYSTEM WITH A STACKABLE PACKAGE AND METHOD OF MANUFACTURE THEREOF

TECHNICAL FIELD

The present invention relates generally to an integrated circuit packaging system, and more particularly to a package on package system.

BACKGROUND ART

Products must compete in world markets and attract many consumers or buyers in order to be successful. It is very important for products to continue to improve in features, performance, and reliability while reducing product costs, product size, and equally important to be available quickly for purchase by the consumers or buyers.

A tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

Therefore, there is an important need that exists for parts in the package to become thinner and thinner to reduce the size of the whole package effectively without sacrificing performance and speed.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a base assembly having a cavity and a through conductor adjacent to the cavity; connecting a first device to the base assembly with the first device within the cavity; connecting a second device to the base assembly with the second device within the cavity; connecting an interposer substrate having an exposed external side over the through conductor with the exposed external side facing away from the through conductor and exposed to ambient.

The present invention provides an integrated circuit packaging system including: a base assembly having a cavity and a through conductor adjacent to the cavity; a first device connected to the base assembly with the first device within the cavity; a second device connected to the base assembly with the second device within the cavity; and an interposer substrate having an exposed external side over the through conductor with the exposed external side facing away from the through conductor and exposed to ambient.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
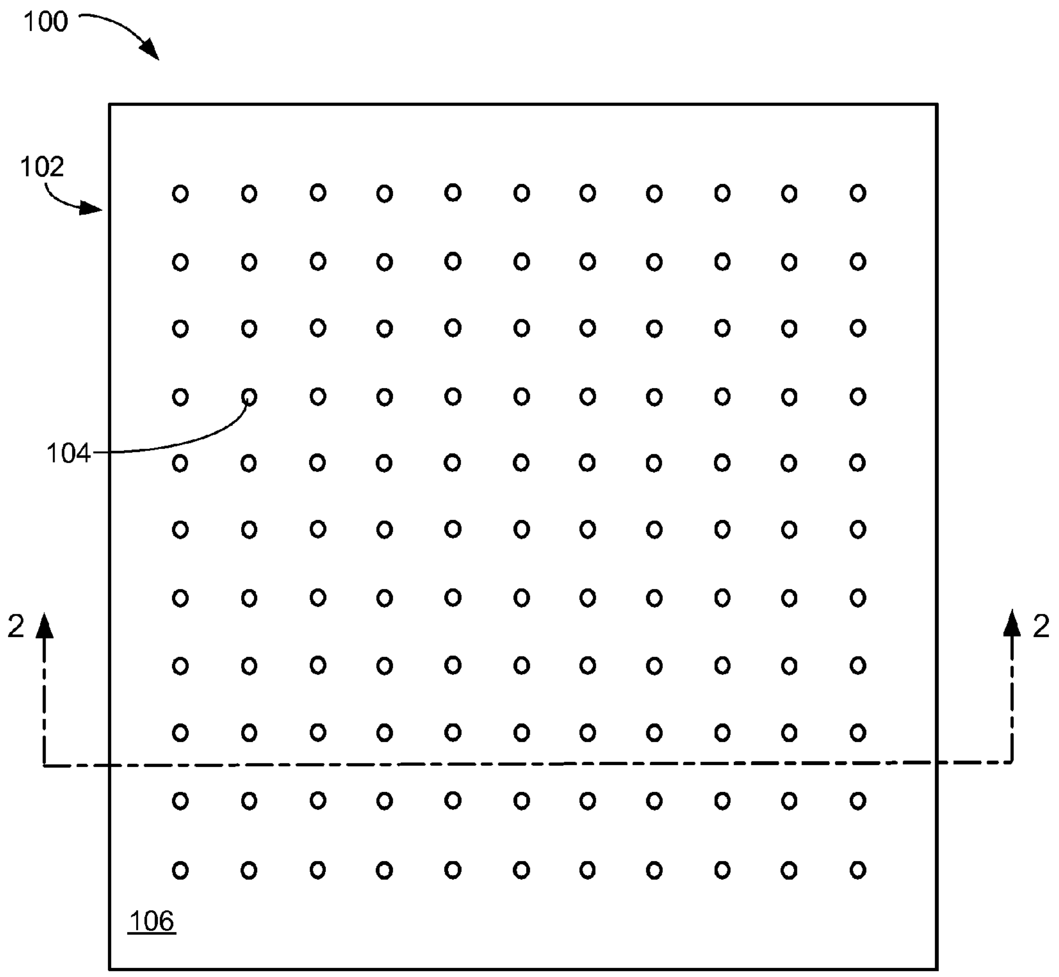
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between elements.

The term "ambient" as used herein is defined as an environment a side, a surface, an electronic structure, or one or more elements of the present invention is physically around, within, and in contact with.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can preferably include an interposer substrate 102, such as an interposer, a laminated substrate, a ceramic substrate, or a circuit board. The interposer substrate 102 can include exposed interposer contacts 104, such as contacts, pads, or vertical insertion areas, on an exposed external side 106 of the interposer substrate 102 and on a side of the interposer substrate 102 opposite the exposed external side 106. The exposed external side 106 is exposed to ambient.

Exposure to ambient is defined as the interposer substrate 102 exposed to the environment such that the interposer substrate 102 can be mounted with a further device (not shown in this figure) and the interposer substrate 102 is not part of the further device. Exposure to ambient is further defined that the interposer substrate 102 is not covered to not obstruct the mounting to the further device to the integrated circuit packaging system 100 that includes the interposer substrate 102.

The exposed interposer contacts 104 can traverse through the interposer substrate 102 and can extend to the opposite horizontal side of the interposer substrate 102. The exposed interposer contacts 104 are shown distributed uniformly across the exposed external side 106 with each of the exposed interposer contacts 104 having a circular shape, as an example. The exposed interposer contacts 104 on the exposed external side 106 can provide connectivity to an external component (not shown) such as another package, a system board, a die, a discrete component, or any combination thereof.

It has been unexpectedly found that the exposed interposer contacts 104 on the exposed external side 106, can provide flexible input/output connectivity with a top package (not shown). The exposed interposer contacts 104, for example, can include a combination of different shapes, pitch spacings, or distributions on the exposed external side 106 to accommodate user specific packages the can mount or stack on to the present invention.

Furthermore, it has been unexpectedly found that the exposed external side 106 of the present invention provides an obstruction free surface that can be entirely used to provide higher input/output external connectivity in comparison to a typical package having a mounting surface with restricted areas, such as mold or encapsulated areas, holes, wire bond areas, or keep out areas.

Figure 2:
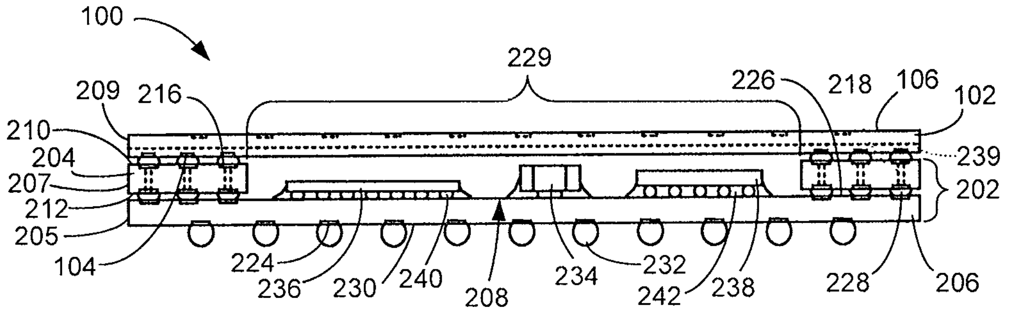
FIG. 2 is a cross-sectional view of the integrated circuit packaging system taken along a line 2-2 of FIG. 1.

Referring now to FIG. 2, therein is shown a cross-sectional view of the integrated circuit packaging system 100 taken along a line 2-2 of FIG. 1. The integrated circuit packaging system 100 can preferably include the interposer substrate 102 mounted over a base assembly 202. The interposer substrate 102 can be oriented with the exposed external side 106 of the interposer substrate 102 facing away from the base assembly 202.

The base assembly 202 can be formed with an interconnect substrate 204, such as a laminated substrate, a ceramic substrate, an interposer, or a circuit board and a base substrate 206, such as a laminated substrate, a ceramic substrate, a circuit board, or a multiple layered laminate. The interconnect substrate 204 can be oriented between the interposer substrate 102 and the base substrate 206 to provide connectivity between the base substrate 206 and the interposer substrate 102. The base substrate 206, the interconnect substrate 204, and the interposer substrate 104 are sized to have coplanar outer peripheral surfaces 205, 207, and 209, respectively.

The interconnect substrate 204 can be formed to provide proper support for the interposer substrate 102 resulting in a structural rigidity and a stability for mounting of a variety of top packages (not shown) having predefined sizes and input/output requirements.

The interconnect substrate 204 can be formed to include a hole 208 using removal process such as a routing or punching process. The hole 208, such as an opening or a cut-out region, can be formed within an interior of the interconnect substrate 204 and extend between an upper side 210 of the interconnect substrate 204 and a lower side 212 of the interconnect substrate 204 opposite the upper side 210.

Interconnect pads 216, such as metal land pads, solder balls, pads, or contacts, exposed on the upper side 210 and the lower side 212, can connect to through conductors 218, such as vias, posts, or columns, inserted or formed within the interconnect substrate 204. The through conductors 218 can preferably surround the hole 208 and provide connectivity between the upper side 210 and the lower side 212. The integrated circuit packaging system 100 includes the interposer substrate 102 having the exposed external side 106 over the through conductors 218 with the exposed external side 106 facing away from the through conductors 218 and exposed to ambient.

The base substrate 206 can be mounted below the interconnect substrate 204. The interconnect pads 216 exposed on the lower side 212 of the interconnect substrate 204 can be attached to base conductors 224, such as contacts, pads, or redistribution layers, exposed on an inward side 226 of the base substrate 206 using an attachment material 228, such as a screen printed solder paste, a conductive adhesive, or a solder.

The hole 208, having an end of the hole 208 covered by the base substrate 206, can form a cavity 229. The interconnect substrate 204 attached over the base substrate 206 can result in the formation of the base assembly 202 having the cavity 229. A portion of the through conductors 218 are adjacent to the cavity 229.

The attachment material 228 can be used to connect the exposed interposer contacts 104 on the side of the interposer substrate 102 opposite the exposed external side 106 with the interconnect pads 216 exposed on the upper side 210. The interposer substrate 102, mounted over the interconnect substrate 204, can cover the cavity 229 of the base assembly 202 resulting in the contents of the cavity 229 surrounded by the interposer substrate 102, the interconnect substrate 204, and the base substrate 206.

It has been discovered that the present invention provides the integrated circuit packaging system 100 with improved electromagnetic interference (EMI) shielding. The through conductors 218 within the interconnect substrate 204, the base substrate 206, and the interposer substrate 102 collectively can provide a radio frequency (RF) shielding ring or cage around electronic components mounted within the cavity 229 of the base assembly 202. The reduction of undesired parasitics over wire bonding with high speed analog or radio frequency based design applications.

Furthermore, it has been discovered that present invention provides the integrated circuit packaging system 100 with improved signal quality, speed, and reliability. The through conductors 218 provide more controlled placement than bond wires. The direct path of the through conductors 218 improves signal quality by eliminating electrical path discontinuities that existing for bond wire connections. With the improved signal quality, increased signal speeds are possible. Moreover, signal, grounds, and power can be better controlled with the through conductors 218 than with bond wires thereby improving the overall performance and reliability of the integrated circuit packaging system 100.

The base conductors 224 can be exposed on an outward side 230 of the base substrate 206, opposite the inward side 226. The base substrate 206 can include a conductive material, such as copper, aluminum, or an alloy of conductive metals, to provide connectivity between the base conductors 224. System connectors 232, such as conductive balls or bumps, optionally can be attached to the base conductors 224 exposed on the outward side 230 and used to connect to a next system level (not shown), such as a system printed circuit board, a package stack assembly, or a package assembly.

One or more passive devices 234, such as integrated passive devices (IPD), resistors, capacitors, or inductors, a first device 236, such as a flip chip, a wire bond chip, a quad flat no leads (QFN) package, a stacked die, or a combination thereof, and a second device 238 horizontally adjacent to the first device 236, can be mounted within the cavity 229 of the base assembly 202. The second device 238 can be similar to the first device 236.

The RF shielding of the electronic components within the cavity 229 can optionally be improved with a conductive plane 239, such as a perforated layer or panel, formed within the interposer substrate 102 and over the base assembly 202 and the cavity 229. The conductive plane 239 can optionally be electrically isolated from all of the exposed interposer contacts 104 and parallel with the exposed external side 106. The conductive plane 239 is shown as horizontally extending from one peripheral side 241 of the interposer substrate 102 to an opposite peripheral side 243 of the interposer substrate 102. The conductive plane 239 is between the exposed external side 106 and an internal side 245 of the interposer substrate 102 opposite the exposed external side 106. The internal side 245 is also referred to as the side of the interposer substrate 102.

It has been discovered that additional cavities, in a manner similar to the cavity 229, can be formed within the base assembly 202 to provide added isolation or RF shielding of the electronic components such as the first device 236, the second device 238, or the passive devices 234. Furthermore, the additional cavities can be formed to each have different profile shapes or sizes to accommodate various quantities or types of other electronic components.

The second device 238 is shown having planar dimensions different from planar dimensions of the first device 236. It is understood that the second device 238 or the first device 236 can have any planar dimensions. For example, the planar dimensions of the first device 236 could be smaller than the planar dimensions of the second device 238.

The passive devices 234 can be connected to the base conductors 224 of the base substrate 206 using solder. Device connectors 240, such as conductive balls, leads, or bumps, can be used to connect the first device 236 or the second device 238 to the base conductors 224 exposed on the inward side 226 of the base substrate 206.

A protective material 242, such as an underfill material or a glob material, optionally can be applied around or over the device connectors 240 to provide protection from damage. The protective material 242 can eliminate any requirements for application of a mold or an encapsulant within the cavity 229.

It has been discovered that the present invention provides the integrated circuit packaging system 100 with improved yield and lower cost. The integrated circuit packaging system 100 eliminates of the molding an encapsulant. This elimination reduces the cost of the integrated circuit packaging system 100 by eliminating the need for custom tooling, materials, process steps, or manufacturing assembly time. This elimination also eliminates the possibility of mold flashes that would damage electrical connections within the integrated circuit packaging system 100 thereby improving yield.

It is noted that the present invention can accommodate optional application of the mold or the encapsulant before or after mounting of the interposer substrate 102, if required.

The exposed interposer contacts 104 on the side of the interposer substrate 102 opposite the exposed external side 106 can be attached to the interconnect pads 216 exposed on the upper side 210 of the interconnect substrate 204 using the attachment material 228.

It has been discovered that the integrated circuit packaging system 100 can be assembled using a strip or tape automated assembly process resulting in improved production efficiency and product quality. The use of strip or tape automated assembly processing can eliminate the traditional pick and place assembly processing of individual parts such as the interposer substrate 102, the base substrate 206, the interconnect substrate 204, or any other parts of the base assembly 202.

Thus, it has been discovered that the integrated circuit packaging system 100 of the present invention furnishes important and heretofore unknown and unavailable solutions, capabilities, and functional aspects for mounting and connectivity to a top package having high input/output connection requirements as well as improved RF or analog based packaging solutions.

Figure 3:
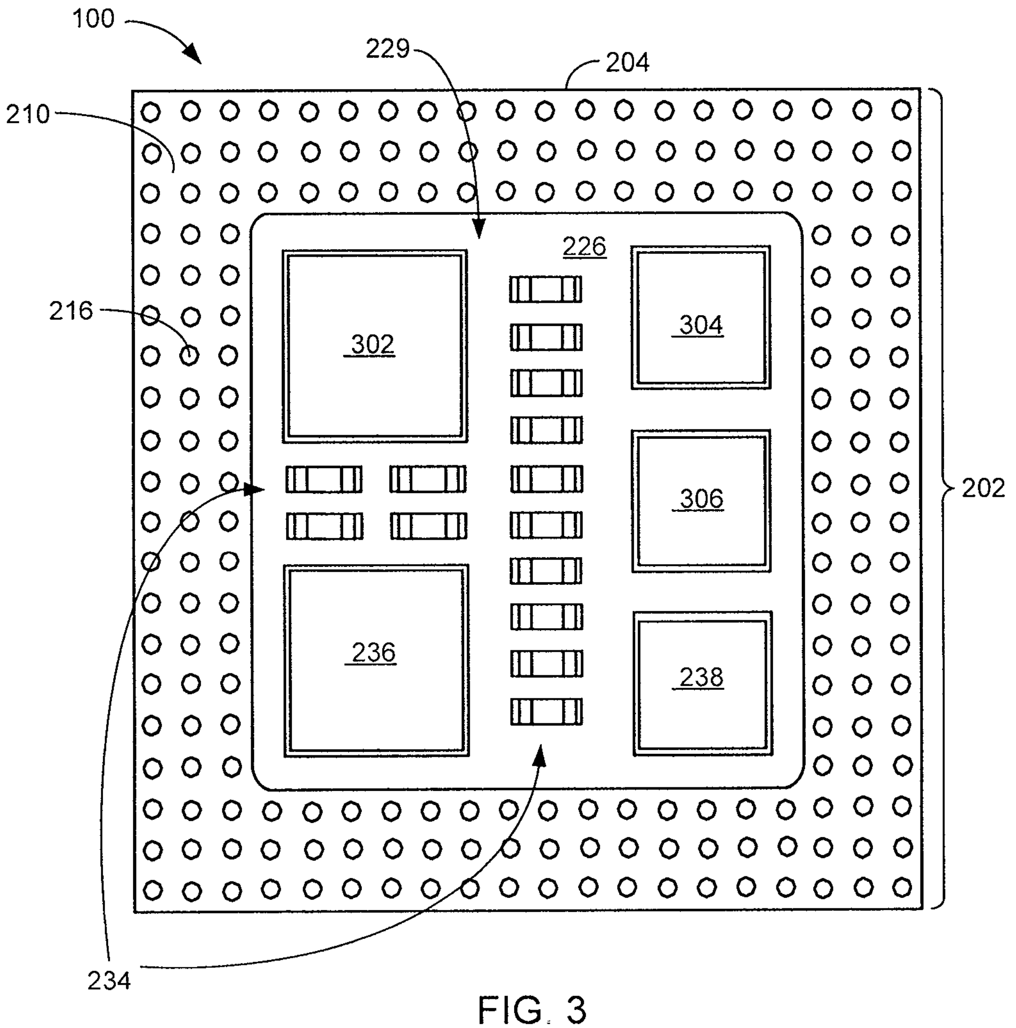
FIG. 3 is a top plan view of the integrated circuit packaging system of FIG. 2.

Referring now to FIG. 3, therein is shown a top plan view of the integrated circuit packaging system 100 of FIG. 2. For purposes of illustration and clarity, the interposer substrate 102 of FIG. 2 is removed from the base assembly 202. Shown are the interconnect substrate 204 and the cavity 229 of the base assembly 202.

For illustrative purposes, the cavity 229 of the base assembly 202 is shown having a square perimeter shape and is centrally oriented in the base assembly 202. It is understood that the cavity 229 the base assembly 202 can have any shape, size, or orientation within the base assembly 202. For example, the cavity 229 could have a circular shape and can be oriented with an offset towards a corner of the base assembly 202.

The passive devices 234, the first device 236, the second device 238, a third device 302, identical to the first device 236, a fourth device 304, identical to the second device 238, and a fifth device 306, are shown connected to the inward side 226 within the cavity 229. The fifth device 306 can be identical to the fourth device 304.

The first device 236 and the third device 302 can be mounted closest to a side of the cavity 229. The second device 238, the fourth device 304, and the fifth device 306 can be mounted closest to a side of the cavity 229 opposite the side closest to the first device 236 and the third device 302. The integrated circuit packaging system 100 can include multiple flip chip devices together with passive components. No molding would be required if the flip chip devices include an underfill.

Figure 4:
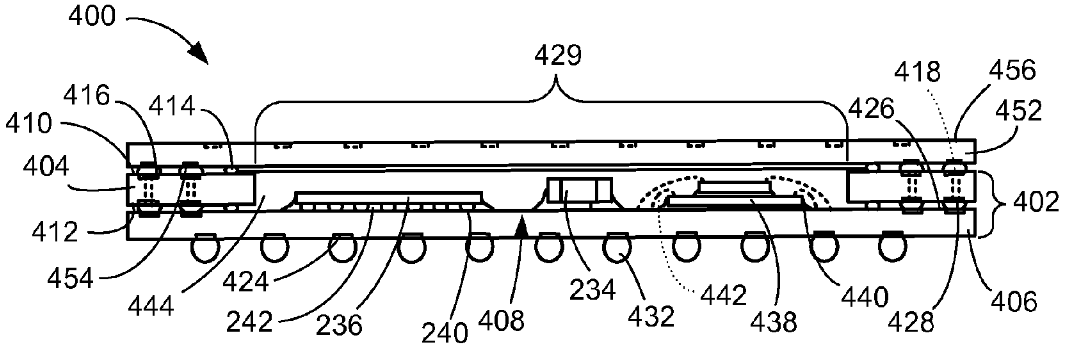
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The integrated circuit packaging system 400 can include a base assembly 402. The base assembly 402 can include an interconnect substrate 404 over a base substrate 406 in a similar structure to the base assembly 202 of FIG. 2, the interconnect substrate 204 of FIG. 2, and the base substrate 206 of FIG. 2.

The interconnect substrate 404 can include a hole 408, formed in a similar structure to the interconnect substrate 204 of FIG. 2 and the hole 208 of FIG. 2. The interconnect substrate 404 can include an upper side 410 and a lower side 412, in a manner similar to the upper side 210 of FIG. 2 and the lower side 212 of FIG. 2.

Seal rings 414, such as a ridges consisting of a metal, a solder paste, or a material chemically inert to mold, encapsulant, or equivalent fill material, can be attached the to the upper side 410, the lower side 412, or the base assembly 402.

The seal rings 414 can surround the hole 408 at opposite ends of the hole 408. The seal rings 414 can be oriented between a perimeter of the hole 408 and interconnect pads 416, similar to the interconnect pads 216 of FIG. 2, closest to the hole 408 and exposed on the upper side 410 or the lower side 412.

The interconnect pads 416 can connect to through conductors 418 of the interconnect substrate 404 in a manner similar to the interconnect substrate 204, the interconnect pads 216 and the through conductors 218 of FIG. 2. The through conductors 418 can surround the hole 408 and can provide connectivity between the upper side 410 and the lower side 412.

The interconnect pads 416 exposed on the lower side 412 can connect the interconnect substrate 404 to base conductors 424 of the base substrate 406 exposed on an inward side 426 using an attachment material 428 in a manner similar to the base conductors 224 of FIG. 2, the inward side 226 of FIG. 2, and the attachment material 228 of FIG. 2.

The interconnect substrate 404 attached over the base substrate 406 can form the base assembly 402 having a cavity 429, such as a crater or depression, in a manner similar to the base assembly 202. A portion of the through conductors 418 is adjacent to the cavity 429.

System connectors 432, similar to the system connectors 232 of FIG. 2, optionally can be attached to the base conductors 224 exposed on the outward side 230, can be used to connect to a next system level (not shown), such as a system printed circuit board, a package stack assembly, or a package assembly.

The cavity 429 can include the passive devices 234, the first device 236, and a second device 438, such as a stacked die, a flip chip, a wire bond chip, a quad flat no leads (QFN) package, a module, a package, or a combination thereof, mounted to the base substrate 406. The passive devices 234 and the first device 236 within the cavity 429 can be connected to the base substrate 406 in a manner substantially the same as in the cavity 229.

The second device 438 can attach to the base substrate 406 using an adhesive 440 such as an adhesive layer, a stacking adhesive, or a glue. The second device 438 can be connected to the base conductors 424 using chip connectors 442, such as bond wires, leads, or pins. The cavity 429 can be filled with an encapsulant 444 using filling process, such as an encapsulating or a molding process, to protect the passive devices 234, the first device 236, the second device 438, or the chip connectors 442. The seal rings 414, surrounding the cavity 429 of the base assembly 402, can prevent or confine the encapsulant 444 from spreading beyond the interior of a perimeter formed by the seal rings 414.

It has been unexpectedly found that the seal rings 414 can significantly minimize waste, loss, and bleed-over of a mold, the encapsulant 444, or a fill material, while provide for a greatly simplified encapsulation procedure.

An interposer substrate 452, such as an interposer, a substrate, or a circuit board, with exposed interposer contacts 454, such as terminal or pads, on an exposed external side 456 of the interposer substrate 102 and on a side of the interposer substrate 452 opposite the exposed external side 456, can be mounted over the base assembly 402. The attachment material 428 can be used to connect the interposer substrate 452 with the base assembly 402 in a manner similar to the attachment material 228.

The interposer substrate 452 mounted over the interconnect substrate 404 can cover the cavity 429 of the base assembly 402 resulting in the contents of the cavity 429 surrounded by the interposer substrate 452, the interconnect substrate 404, and the base substrate 406.

The exposed interposer contacts 454 on the exposed external side 456 can provide connectivity to between an external component such as another package, a system board, a die, a discrete component, or any combination thereof and the integrated circuit packaging system 400.

Figure 5:
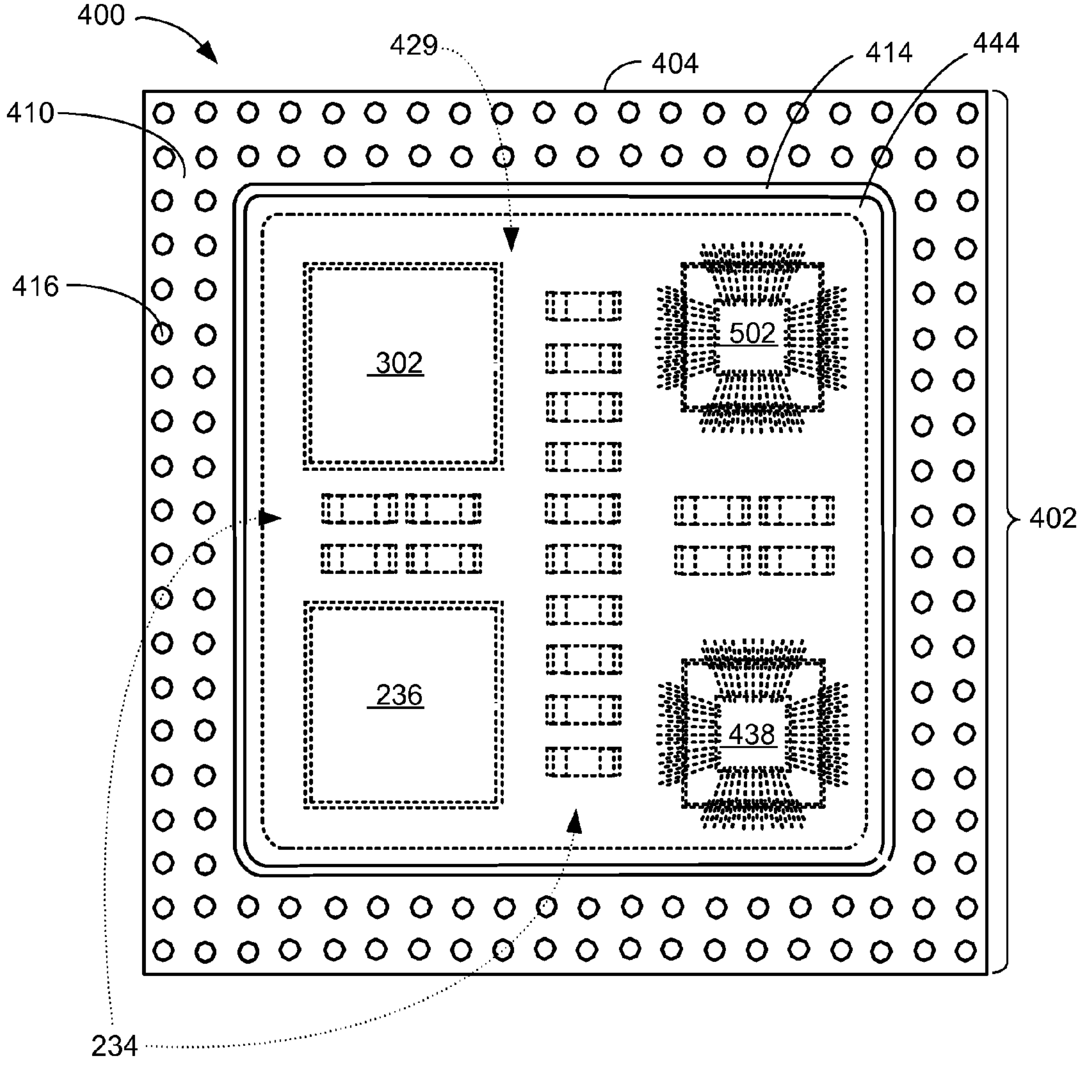
FIG. 5 is a top plan view of the integrated circuit packaging system of FIG. 4.

Referring now to FIG. 5, therein is shown a top plan view of the integrated circuit packaging system 400 of FIG. 4. For purposes of illustration and clarity, the interposer substrate 452 of FIG. 4 is removed from the base assembly 402. Shown are the interconnect substrate 404, the encapsulant 444, and one of the seal rings 414 on the upper side 410 of the interconnect substrate 404.

Shown with dotted lines, below the encapsulant 444, are the cavity 429, the passive devices 234, the first device 236, the second device 438, the third device 302, and a fourth device 502. The first device 236 and the third device 302 can be mounted closest to a side of the cavity 429. The second device 438 and the fourth device 502 can be mounted closest to a side of the cavity 429 opposite the side closest to the first device 236 and the third device 302.

Rows of the passive devices 234 can be mounted between the first device 236 and the third device 302 and between the second device 438 and the fourth device 502. Additional rows of the passive devices 234 can be mounted a column formed by the first device 236 and the third device 302 and a column formed by the second device 438 and the fourth device 502. The interconnect pads 416 are shown exposed on the interconnect substrate 404 surrounding the encapsulant 444.

The seal rings 414 on the inward side 426 of FIG. 4, the upper side 410, or the lower side 412 of FIG. 4, can seal the cavity 429 to provide protection to components, such as wire bonded devices, chips or interconnects located within the cavity 429. The encapsulant 444 can be confined within the cavity 429 and a perimeter formed by the seal rings 414 during an encapsulation dispensing process. Any combination of passives, quad flat no leads (QFN) packages, stacked dice, flip chips, integrated passive devices (IPD), or other devices can be assembled within the cavity 429 of the integrated circuit packaging system 400.

Figure 6:
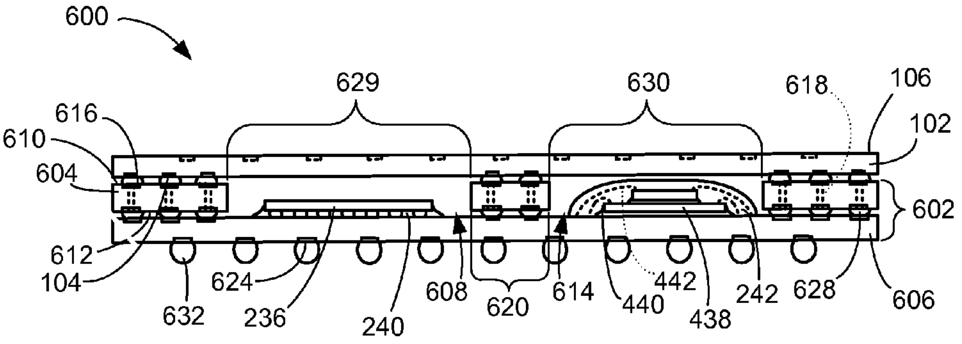
FIG. 6 is a cross-sectional view of an integrated circuit packaging system in a third embodiment of the present invention.

Referring now to FIG. 6, therein is shown a cross-sectional view of an integrated circuit packaging system 600 in a third embodiment of the present invention. The integrated circuit packaging system 600 can include similarities to the integrated circuit packaging system 100 of FIG. 2. The integrated circuit packaging system 600 can include a base assembly 602 having an interconnect substrate 604 over a base substrate 606 both of which may differ than the interconnect substrate 204 of FIG. 2 and to the base substrate 206 of FIG. 2.

The interconnect substrate 604 can preferably include a first hole 608, such as an opening or a cut-out region. The first hole 608 can have an offset towards an end of the interconnect substrate 604. The first hole 608 can be formed and extend between an upper side 610 and a lower side 612 of the interconnect substrate 204 in a manner similar to the hole 208 of FIG. 2, the upper side 210 of FIG. 2, and the lower side 212 of FIG. 2.

The interconnect substrate 604 can preferably include a second hole 614, formed in a manner similar to the first hole 608. The second hole 614 can be offset towards an end of the interconnect substrate 604 opposite the end closest to the first hole 608.

The interconnect substrate 604 can include interconnect pads 616 and through conductors 618 surrounding the first hole 608 and surrounding the second hole in a manner similar to the interconnect pads 216 of FIG. 2, the hole 208, and the through conductors 218 of FIG. 2. Spacer portions 620 of the interconnect substrate 604, formed between the first hole 608 and the second hole 614, can include the interconnect pads 616 and the through conductors 618.

The base substrate 606 can be mounted below the interconnect substrate 604. The interconnect pads 616 exposed on the lower side 612 of the interconnect substrate 604 can be attached to base conductors 624 using an attachment material 628 similar to the attachment material 228 of FIG. 2 in a manner similar to the interconnect pads 216, the lower side 212, and the base conductors 224 of FIG. 2.

An end of the first hole 608 and end of the second hole 614 covered below by the base substrate 606 can form a first cavity 629 and a second cavity 630, respectively. The interconnect substrate 604 attached over the base substrate 606 forms the base assembly 602 having the first cavity 629 and the second cavity 630. A portion of the through conductors 618 are adjacent to the first cavity 629 and the second cavity 630.

The first cavity 629 can include the first device 236 connected to the base conductors 624 of the base substrate 606 in a manner substantially the same as in the cavity 229 using the device connectors 240. The second cavity 630 can include the second device 438 mounted to the base substrate 606.

The second device 438 can be attached to the base substrate 606 using the adhesive 440 and connected to the base conductors 624 using the chip connectors 442. The protective material 242 can cover the device connectors 240 or the second device 438 and the chip connectors 442.

The interposer substrate 102 can be mounted over and connected to the base assembly 602 in a manner similar to the base assembly 202 of FIG. 2. System connectors 632, similar to the system connectors 232 of FIG. 2, optionally can be attached to the base conductors 624 of the base substrate 606 opposite the side of the base substrate 606 having the first device 236. The base conductors 624 can be used to connect to a next system level (not shown), such as a system printed circuit board, a package stack assembly, or a package assembly.

Figure 7:
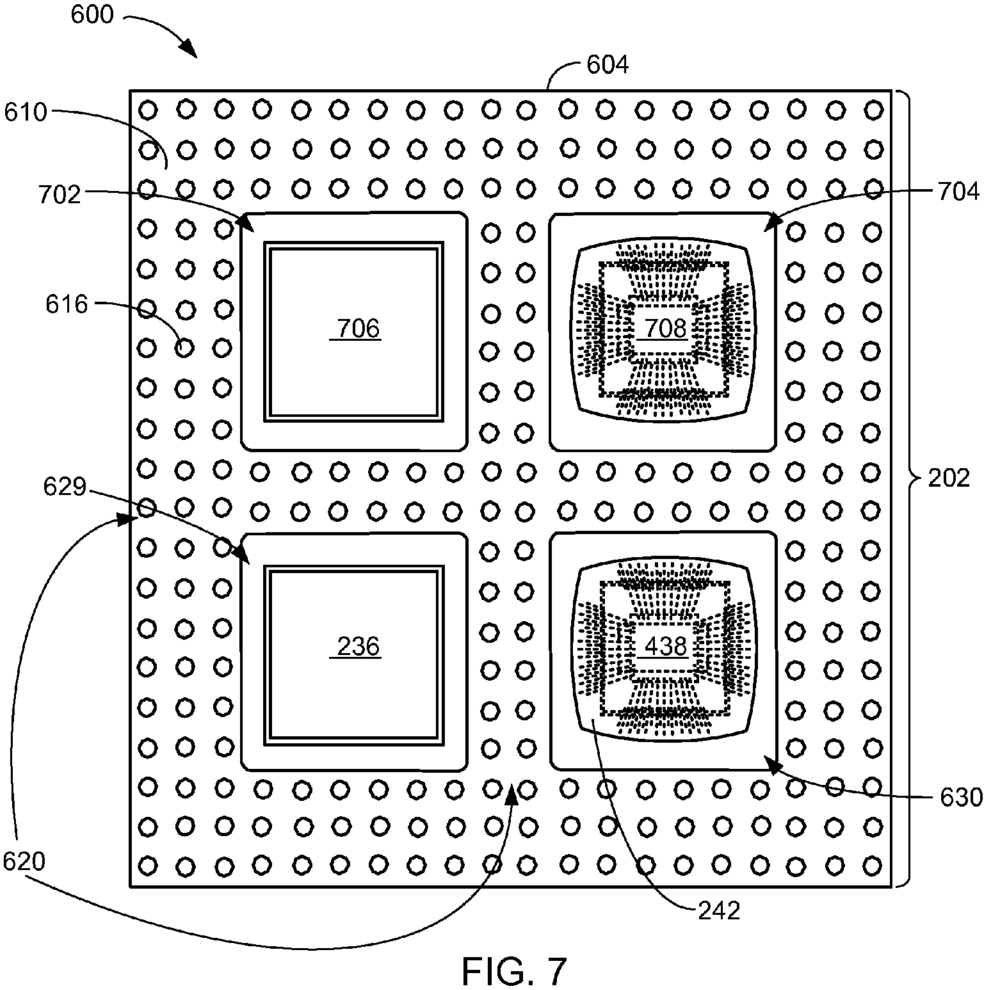
FIG. 7 is a top plan view of the integrated circuit packaging system of FIG. 6.

Referring now to FIG. 7, therein is shown a top plan view of the integrated circuit packaging system 600 of FIG. 6. For purposes of illustration and clarity, the interposer substrate 102 of FIG. 6 is removed from the base assembly 602. Four corners of the interconnect substrate 604 can be referred to as a first perimeter corner, a second perimeter corner, a third perimeter corner opposite from the second perimeter corner, and a fourth perimeter corner opposite from the first perimeter corner.

The first cavity 629 is shown formed closest to the first perimeter corner of the interconnect substrate 604. The second cavity 630 is shown formed closest to the second perimeter corner of the interconnect substrate 604. A third cavity 702 is shown formed closest to the third perimeter corner. A fourth cavity 704 can be formed closest to a fourth perimeter corner of the interconnect substrate 604. A portion of the through conductors 618 of FIG. 6 are adjacent to the third cavity 702 and the fourth cavity 704.

The first device 236 is shown mounted within the first cavity 629. The second device 438 is shown with dotted lines below the protective material 242 mounted within the second cavity 630. A third device 706, similar to the first device 236, is shown mounted within the third cavity 702. A fourth device 708, similar to the second device 438, is shown with dotted lines below the protective material 242 mounted within the fourth cavity 704.

The spacer portions 620 of the interconnect substrate 604 can be between and separate the first cavity 629, the second cavity 630, the third cavity 702, and the fourth cavity 704 from each other. The interconnect pads 616 are shown exposed on the upper side 610 of the interconnect substrate 604 surrounding the first cavity 629, the second cavity 630, the third cavity 702, or the fourth cavity 704.

It has been discovered that the present invention provides the integrated circuit packaging system 600 with improved EMI shielding performance. The interconnect substrate 604 having individual cavity to provide added shielding between devices, additional support for the interposer substrate 102 of FIG. 6, and provide an increase in area for interconnections between the base assembly 202 and the interposer substrate 102.

Figure 8:
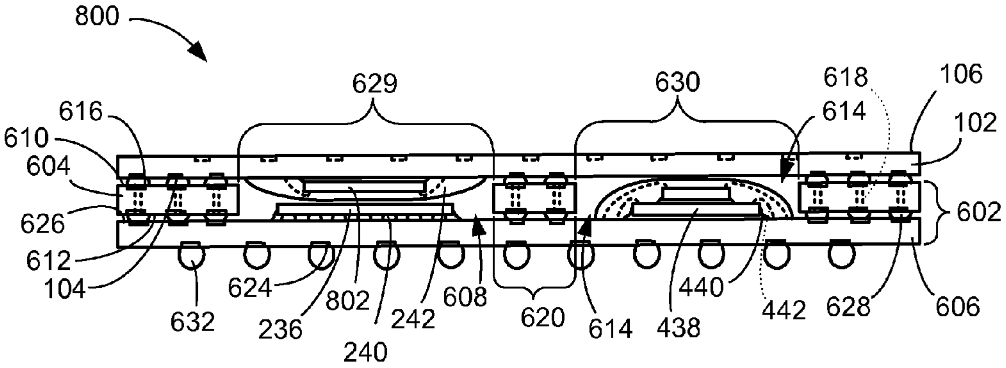
FIG. 8 is a cross-sectional view of an integrated circuit packaging system in a fourth embodiment of the present invention.

Referring now to FIG. 8, therein is shown a cross-sectional view of an integrated circuit packaging system 800 in a fourth embodiment of the present invention. The integrated circuit packaging system 800 can be similar to the integrated circuit packaging system 600 of FIG. 2 except the integrated circuit packaging system 800 can include an interposer device 802.

The interposer device 802, such as a wire bond device, a flip chip, a die, a passive device, or a combination thereof, can be mounted on to the side of the interposer substrate 102 opposite the exposed external side 106 and over the first device 236 using the adhesive 440.

The interposer device 802, oriented in the first cavity 629, can be connected to the exposed interposer contacts 104 on the side of the interposer substrate 102 opposite the exposed external side 106 using the chip connectors 442. The protective material 242 can be applied around or over the interposer device 802 to protect the chip connectors 442.

The interposer substrate 102 can be mounted over the base assembly 602 with the exposed external side 106 facing away from the base assembly 602. The exposed interposer contacts 104 on the side of the interposer substrate 102 opposite the exposed external side 106 can be connected to the interconnect pads 616 exposed on the upper side 610 of the interconnect substrate 604 using the attachment material 628.

The interconnect pads 616 exposed on the lower side 612 of the interconnect substrate 604 can be connected to the base conductors 624 of the base substrate 606 using the attachment material 628 in a manner similar to the interconnect pads 216 of FIG. 2, the interconnect substrate 204 of FIG. 2, the base conductors 224 of FIG. 2, and the attachment material 228 of FIG. 2. The through conductors 618 within the interconnect substrate 604 can provide connectivity between the interconnect pads 616 exposed on the interconnect substrate 604.

The first device 236, within the first cavity 629, facing the interposer device 802 can be connected to the base conductors 624 using the device connectors 240 in a manner similar to the cavity 229 of FIG. 2. The second device 438, within the second cavity 630, can be connected to the base conductors 624 of the base substrate 606 using the chip connectors 442.

The system connectors 632 can be used to provide connectivity between a next system level and the integrated circuit packaging system 800 or any circuitry connecting to the exposed interposer contacts 104 on the exposed external side 106 of the interposer substrate 102.

The integrated circuit packaging system 800 includes the spacer portions 620 to provide RF isolation for the electronic components located within any of the cavities formed in the base assembly 602.

Figure 9:
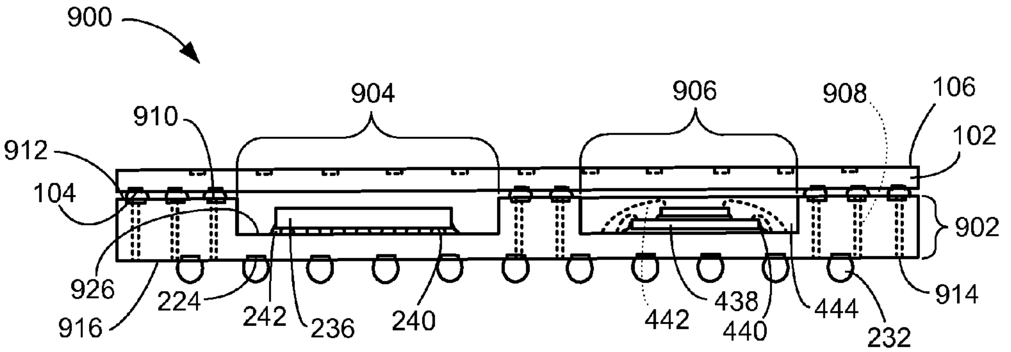
FIG. 9 is a cross-sectional view of an integrated circuit packaging system in a fifth embodiment of the present invention.

Referring now to FIG. 9, therein is shown a cross-sectional view of an integrated circuit packaging system 900 in a fifth embodiment of the present invention. The integrated circuit packaging system 900 can preferably include the interposer substrate 102 and a base assembly 902. The base assembly 902, such as a substrate, a circuit board, or a multiple layered laminate, can be formed having a first cavity 904 and a second cavity 906 similar to the first cavity 904.

The first cavity 904 or the second cavity 906 of the base assembly 902 can be formed by removing a portion of the base assembly 902 using a removal process, such as routing, grinding, drilling, etching, or a fabrication specified removal process. The first cavity 904 and the second cavity 906 can also be formed directly from a lamination process used to form the base assembly 902.

For illustrative purposes, the base assembly 902 is shown with the first cavity 904 and the second cavity 906. The base assembly 902 can have any number of the cavities. The base assembly 902, for example, could be formed having three cavities. Dimensions or shapes of the first cavity 904 or the second cavity 906 can be different. For example, the first cavity 904 can have a circular shape and the second cavity 906 can have a square shape.

Through conductors 908, such as vias, posts, or columns, can be inserted or formed within the base assembly 902. Each of the through conductors 908 have a top exposed end 910 on a top side 912 and an bottom exposed end 914 on a bottom side 916. A portion of the through conductors 908 are adjacent to the first cavity 904 and the second cavity 906.

The base conductors 224, exposed on the top side 912 or the bottom side 916, can be used to provide connectivity to the top exposed end 910 or to the bottom exposed end 914 of the through conductors 908. Conductive material layers, such as copper layers, aluminum layers, or a re-distribution layer (RDL), can be used to provide connections between or within sides of the base assembly 902 and with the through conductors 908.

The first device 236, within the first cavity 904, can be connected to the conductive material layers using the device connectors 240. The protective material 242 can be applied around or over the device connectors 240. The second device 438, within the second cavity 906, can be attached to the top side 912 and connected to the base conductors 224 using the chip connectors 442.

The second cavity 906 can be filled with the encapsulant 444 to protect the second device 438 or the chip connectors 442. The exposed interposer contacts 104, on the side of the interposer substrate 102 opposite the exposed external side 106, can be connected to the base conductors 224 exposed on the top side 912 using the attachment material 228.

The first cavity 904 or the second cavity 906 can be surrounded by the through conductors 908. The exposed interposer contacts 104 on the exposed external side 106 can provide connectivity with an external component (not shown), such as another package, a system board, a die, a discrete component, or any combination thereof.

The system connectors 232 can be attached to the base conductors 224 exposed on the bottom side 916 using the attachment material 228. The system connectors 232 can be used to connect to a next level of integration, such as a system printed circuit board (not shown), a package stack assembly (not shown), or a package assembly (shown).

Figure 10:
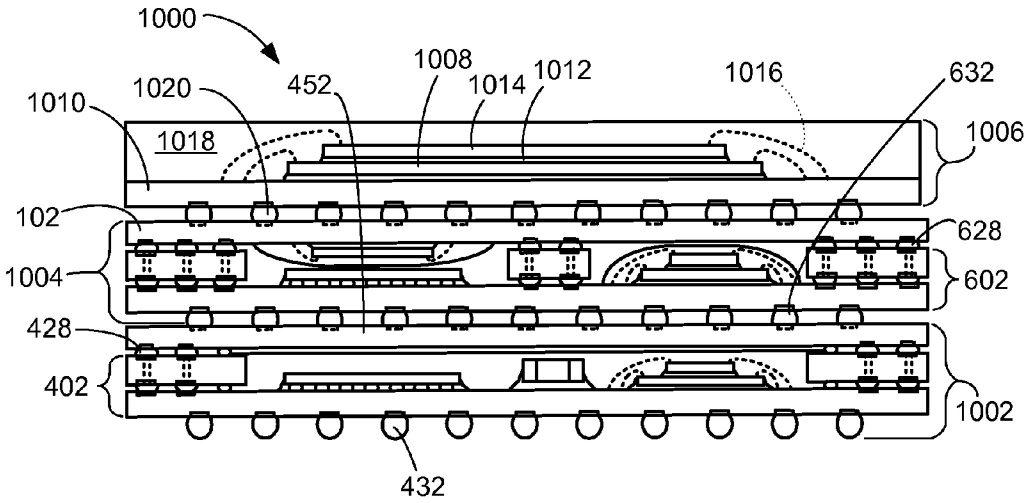
FIG. 10 is a cross-sectional view of an integrated circuit packaging system in a sixth embodiment of the present invention.

Referring now to FIG. 10, therein is shown a cross-sectional view of an integrated circuit packaging system 1000 in a sixth embodiment of the present invention. The integrated circuit packaging system 1000 can preferably include a base package 1002 can be identical to the integrated circuit packaging system 400 of FIG. 4.

A first stack package 1004 can be identical to the integrated circuit packaging system 800 of FIG. 8 and can be attached over the base package 1002. A second stack package 1006, such as a multiple chip package, a package in package module, a package on package module, or an integrated circuit package, can be attached over the first stack package 1004.

The second stack package 1006 can preferably include a first die 1008, such as a chip, module, or integrated circuit package, mounted over a package substrate 1010 using an attachment adhesive 1012, such as a glue, an epoxy, or a bonding agent. A second die 1014, similar to the first die 1008 but having dimensions smaller than dimensions of the first die 1008, can be mounted over the first die 1008 using the attachment adhesive 1012.

Die interconnects 1016, such as bond wires, conductive balls, conductive bumps, or conductive leads, can be used to connect the first die 1008 with the package substrate 1010, the second die 1014 with the package substrate 1010, or the first die 1008 with the second die 1014. A package encapsulant 1018 can cover or surround the first die 1008, the second die 1014, the die interconnects 1016, or the package substrate 1010.

Package connectors 1020, such as solder balls, solder bumps, pins, or leads, can connect the package substrate 1010 to the interposer substrate 102 of the first stack package 1004. The interposer substrate 102 can be connected to the base assembly 602 of the first stack package 1004 using the attachment material 628.

The first stack package 1004 can be connected to the interposer substrate 452 of the base package 1002 using the system connectors 632. The interposer substrate 452 can be connected to the base assembly 402 using the attachment material 428.

The system connectors 432 on the base assembly 402 can connect the integrated circuit packaging system 1000 to next level of integration, such as a system printed circuit board (not shown), a package stack assembly (not shown), or a package assembly (shown).

Figure 11:
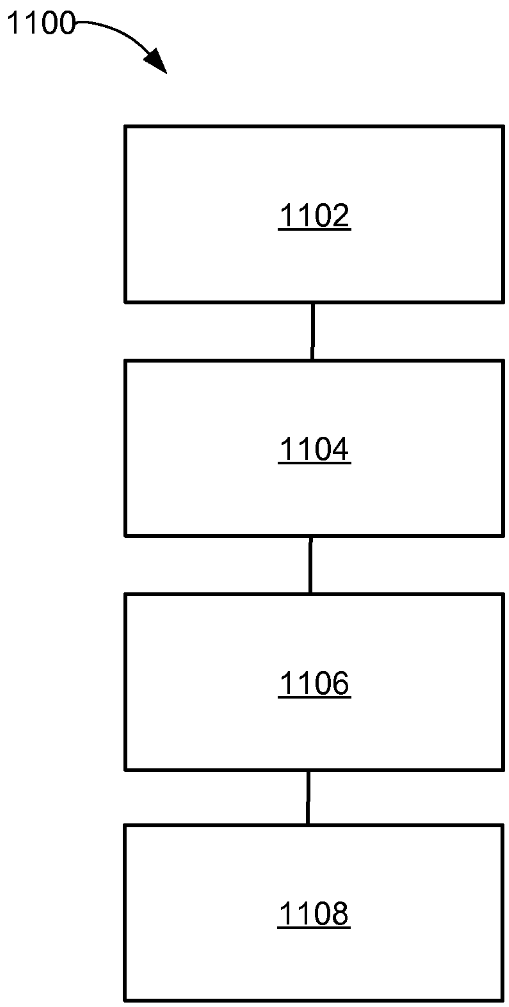
FIG. 11 is a flow chart of a method of manufacture of an integrated circuit packaging system in an embodiment of the present invention.

Referring now to FIG. 11 therein is shown a flow chart of a method 1100 of manufacture of an integrated circuit packaging system in an embodiment of the present invention. The method 1100 includes forming a base assembly having a cavity and a through conductor adjacent to the cavity in a block 1102; connecting a first device to the base assembly with the first device within the cavity in a block 1104; connecting a second device to the base assembly with the second device within the cavity in a block 1106; and connecting an interposer substrate having an exposed external side over the through conductor with the exposed external side facing away from the through conductor and exposed to ambient in a block 1108.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

forming a base assembly having a base substrate and an interconnect substrate, the base substrate and the interconnect substrate each having an outer peripheral surface coplanar with the outer peripheral surface of the other and cooperating to form a cavity in the base assembly, the interconnect substrate having a columnar through conductor adjacent to the cavity with a conductive attachment material conductively connected to the columnar through conductor for attaching the interconnect substrate to the base substrate;

connecting a first device to the base assembly with the first device within the cavity;

connecting a second device to the base assembly with the second device horizontally adjacent to the first device and within the cavity; and connecting an interposer substrate having an outer peripheral surface coplanar with the outer peripheral surface of the interconnect substrate, the interposer substrate having a conductive attachment material conductively connected to the columnar through connector for attaching the interposer substrate to the interconnect substrate, the interposer substrate covering the cavity.

2. The method as claimed in claim 1 wherein connecting the interposer substrate includes:

providing a conductive plane on the interposer substrate covering the cavity.

3. The method as claimed in claim 1 further comprising attaching a seal ring to the base assembly around the cavity.

4. The method as claimed in claim 1 further comprising:

connecting an interposer device to the interposer substrate; and wherein connecting the interposer substrate over the through conductor includes:

mounting the interposer device within the cavity and over the first device.

5. The method as claimed in claim 1 further comprising connecting a passive device to the base assembly with the passive device within the cavity.

6. A method of manufacture of an integrated circuit packaging system comprising:

forming a base assembly having a base substrate and an interconnect substrate, the base substrate and the interconnect substrate each having an outer peripheral surfaces coplanar with the outer peripheral surface of the other and cooperating to form a cavity in the base assembly, the interconnect substrate having a plurality of columnar through conductors around and adjacent to the cavity with conductive attachment material conductively connected to the columnar through conductors for attaching the interconnect substrate to the base substrate;

connecting a first device to the base assembly with the first device within the cavity;

connecting a second device to the base assembly with the second device horizontally adjacent to the first device and within the cavity; and connecting an interposer substrate having a coplanar outer peripheral surface with the coplanar outer peripheral surfaces of the base substrate and the interconnect substrate, the interposer substrate having conductive attachment material conductively connected to the plurality of columnar through connectors for attaching the interposer substrate to the interconnect substrate, the interposer substrate covering the cavity.

7. The method as claimed in claim 6 wherein connecting the interposer substrate includes a conductive plane parallel to an exposed external side of the interposer substrate and over the base assembly.

8. The method as claimed in claim 6 further comprising:

attaching a first stack package over the interposer substrate with the first stack package having a further interposer substrate; and attaching a second stack package over the first stack package with the second stack package connected to the further interposer substrate.

9. The method as claimed in claim 6 wherein forming the base assembly having the cavity includes forming the base assembly with a spacer portion adjacent to the cavity.

10. The method as claimed in claim 6 wherein connecting the first device includes encapsulating the first device.

11. An integrated circuit packaging system comprising:

a base assembly having a base substrate and an interconnect substrate, the base substrate and the interconnect substrate having coplanar outer peripheral surfaces and cooperating to form a cavity in the base assembly, the interconnect substrate having a columnar through conductor adjacent to the cavity with a conductive attachment material conductively connected to the columnar through conductor for attaching the interconnect substrate to the base substrate;

a first device connected to the base assembly with the first device within the cavity;

a second device connected to the base assembly with the second device horizontally adjacent to the first device and within the cavity; and an interposer substrate having a coplanar outer peripheral surface with the coplanar outer peripheral surfaces of the base substrate and the interconnect substrate, the interposer substrate having a conductive attachment material conductively connected to the columnar through connector for attaching the interposer substrate to the interconnect substrate, the interposer substrate covering the cavity.

12. The system as claimed in claim 11 wherein the interposer substrate includes a conductive plane on the interposer substrate covering the cavity.

13. The system as claimed in claim 11 further comprising a seal ring attached to the base assembly around the cavity.

14. The system as claimed in claim 11 further comprising an interposer device connected to the interposer substrate and the interposer device within the cavity and over the first device.

15. The system as claimed in claim 11 further comprising a passive device connected to the base assembly with the passive device within the cavity.

16. The system as claimed in claim 11 wherein:

the interconnect substrate has a plurality of columnar through conductors adjacent to the cavity with conductive attachment material conductively connected to the columnar through conductors for attaching the interconnect substrate to the base substrate; and the interposer substrate having conductive attachment material conductively connected to the columnar through connectors for attaching the interposer substrate to the interconnect substrate.

17. The system as claimed in claim 16 wherein the interposer substrate includes a conductive plane parallel to an exposed external side of the interposer substrate and over the base assembly.

18. The system as claimed in claim 16 further comprising:

a first stack package over the interposer substrate with the first stack package having a further interposer substrate; and a second stack package over the first stack package with the second stack package connected to the further interposer substrate.

19. The system as claimed in claim 16 wherein the base assembly includes a spacer portion adjacent to the cavity.

20. The system as claimed in claim 16 wherein the first device is encapsulated.

* * * * *